(12) United States Patent
Sung

(10) Patent No.: US 6,184,093 B1
(45) Date of Patent: Feb. 6, 2001

(54) METHOD OF IMPLEMENTING DIFFERENTIAL GATE OXIDE THICKNESS FOR FLASH EEPROM

(75) Inventor: Kuo-Tung Sung, Hsinchu (TW)

(73) Assignee: Mosel Vitelic, Inc., Hsinchu (TW)

( * ) Notice: Under 35 U.S.C. 154(b), the term of this patent shall be extended for 0 days.

(21) Appl. No.: 09/137,609

(22) Filed: Aug. 21, 1998

(30) Foreign Application Priority Data

Dec. 19, 1997 (TW) ................................................. 86119292

(51) Int. Cl.[7] ................. H01L 21/8234; H01L 21/8238; H01L 21/336
(52) U.S. Cl. ............................ 438/275; 438/211; 438/258; 438/981
(58) Field of Search ..................................... 438/211, 954, 438/275, 981, 283, 257, 258, 197, 264

(56) References Cited

U.S. PATENT DOCUMENTS

| Re. 35,094 | 11/1995 | Wu et al. ................. 437/43 |
| 5,066,992 | 11/1991 | Wu et al. ............... 357/23.5 |
| 5,202,850 | 4/1993 | Jeng ...................... 365/185 |
| 5,278,087 | 1/1994 | Jeng ...................... 437/43 |
| 5,432,114 * | 7/1995 | O ............................. 437/56 |
| 5,440,159 | 8/1995 | Larsen et al. ........... 257/318 |
| 5,445,983 * | 8/1995 | Hong ...................... 437/43 |
| 5,493,534 | 2/1996 | Mok ...................... 365/226 |
| 5,587,951 | 12/1996 | Jazayeri et al. .......... 365/203 |
| 5,606,532 | 2/1997 | Lambrache et al. ....... 365/238.5 |
| 5,658,812 * | 8/1997 | Araki ...................... 438/258 |
| 5,680,346 | 10/1997 | Pathak et al. ............ 365/185.1 |
| 5,888,869 * | 3/1999 | Cho et al. ................ 438/258 |
| 5,953,599 * | 9/1999 | El-Diwany ............... 438/199 |
| 5,960,289 * | 9/1999 | Tsui et al. ............... 438/275 |
| 6,004,847 * | 12/1999 | Clementi et al. .......... 438/258 |

OTHER PUBLICATIONS

Stanley Wolf, Ph.D., *Silicon Processing for the VLSI ERA, vol. II: Process Intefration*, (1990), Lattice Press, pp. 634–635.

* cited by examiner

Primary Examiner—Amir Zarabian
Assistant Examiner—Adam Pyonin
(74) Attorney, Agent, or Firm—Townsend and Townsend and Crew, LLP

(57) ABSTRACT

Improved methods for fabricating semiconductor integrated circuit devices, in particular flash EEPROM devices. According to an embodiment, the present invention provides a method of forming a semiconductor device having a gate oxide layer (120) that is thin in some regions, such as the cell region, and thicker in other regions (155), such as the periphery region. The method provides the gate oxide layer with different thicknesses without the thickness control problems of prior art methods that use contaminant-containing photoresist with an etching step. According to the present invention, the gate oxide has a first thickness that is sufficiently thin to provide high driving capability for the semiconductor device, and a second thickness that is sufficiently thick to provide high voltage reliability of the semiconductor device.

23 Claims, 10 Drawing Sheets

METHOD OF IMPLEMENTING DIFFERENTIAL GATE OXIDE THICKNESS FOR FLASH EEPROM

BACKGROUND OF THE INVENTION

The present invention relates to semiconductor integrated circuits and their manufacture. The invention is illustrated in an example with regard to the manufacture of a read only memory ("ROM") cell, and more particularly to the manufacture of a flash electrically-erasable programmable read only memory ("Flash EEPROM") cell, but it will be recognized that the invention has a wider range of applicability. Merely by way of example, the invention may be applied in the manufacture of other semiconductor devices such as mask ROMs, microcontrollers, microprocessors ("MICROs"), digital signal processors ("DSPs"), application specific integrated circuits, among others.

Read only memories (ROMs) and various methods of their manufacture are known in the art. In the fabrication of a ROM, particularly an EEPROM, it is necessary to fabricate a storage cell that maintains data after the applied power is turned off, that is, a storage cell having almost permanent data characteristics. The storage cells are generally mass data storage files where each cell corresponds to the presence or absence of a stored charge on a "floating" gate of a storage cell transistor. Specifically, the storage cell includes at least two conducting layers—one conducting layer is the floating gate of the storage cell transistor, and another conducting layer is the control gate for control of the cell operation—which may be, for example, polysilicon. In a typical device, the floating gate is formed on a thin gate oxide formed on the substrate, and the control gate is located above the floating gate. In such a device, the control gate and floating gate are isolated each other by a thin dielectric layer known as an "interpoly oxide", which may typically be composed of oxide/nitride/oxide ("ONO"). In some typical EEPROMs, data is programmed into the cells by applying a high voltage to the control gate to inject hot electrons (or tunnel electrons in some devices) into the floating gate. The process of programming data is often called coding. In coding, the charge is transferred from the silicon substrate through the thin gate oxide layer to the floating gate.

In typical EEPROMs, especially for flash EEPROMs, two different gate oxide thicknesses are required for optimized device performance. In such devices, it is critical to grow a high-quality, thin gate oxide (used as a tunneling oxide) in the storage cell and a thick gate oxide in transistors in the periphery of the storage cell region in order to provide high driving capability for higher speed. Controlling the thickness of the thin gate oxide is crucial, especially since design rules for devices with gates are becoming increasingly smaller and require thinner gate oxides. However, because high-voltage supplies are used, thicker gate oxides at the periphery and the storage cell region are needed to maintain device quality and reliability after long-term high voltage stress from the high voltages (e.g., up to or greater than +12V) generated through a pumping circuit for the storage cell coding and/or erase. Therefore, implementing different gate oxide thicknesses in EEPROM devices is an important aspect of the fabrication of high performance devices.

Prior art methods for forming different gate oxide thicknesses in ROMs have typically involved the use of photoresist in combination with either a dry or wet etch step. First, a thick gate oxide is grown on a silicon substrate and masked with a photoresist. The photoresist used makes physical contact with and masks a portion of the thick gate oxide, while the etch step removes some of the gate oxide to provide a thinner gate oxide. Such photoresist typically contains many contaminants which degrade the ability of the thick gate oxide to resist long-term high voltage stresses. Moreover, use of a dry etch creates the possibility of over-etching in some portions of the gate oxide down to the silicon substrate to damage the substrate and degrade the quality of the gate oxide layer. Even if the dry etch does not over-etch, the use of a dry etch may also present problems for gate oxide quality and oxide thickness control.

From the above it is seen that an improved method of fabricating semiconductor ROM devices with a reliable, high-quality gate oxide having different thicknesses is often desired. Further, improved methods are needed which are able to provide with adequate thickness control high-quality gate oxides, especially for increasingly smaller device dimensions, that are sufficiently thin in certain regions such as in the cell regions and in periphery regions and thicker in other regions such as periphery regions.

SUMMARY OF THE INVENTION

The present invention provides an improved method and resulting structure for an integrated circuit device. In particular, the present invention provides an improved ROM integrated circuit and method of manufacture therefor.

According to an embodiment, the present invention provides a method of forming a semiconductor device. The method includes the steps of providing a semiconductor substrate including a memory region and a periphery region, forming a first gate oxide layer having a first thickness on the semiconductor substrate, forming a first conducting layer on the first gate oxide layer, and masking and patterning the first conducting layer and the first gate oxide layer to form a first memory gate electrode in the memory region and a first periphery gate electrode in the periphery region. The method also includes the steps of forming by thermal oxidation a second gate oxide layer having a second thickness different than the first thickness, forming a second conducting layer on the second gate oxide layer, and masking and patterning the second conducting layer and the second gate oxide to form a second memory gate electrode in the memory region and a second periphery gate electrode in the periphery region.

A further aspect of the invention provides a method and resulting structure for manufacturing integrated circuits such as flash memory devices that require the use of differing gate oxide thicknesses. These flash memory devices would be fabricated in an active or cell region with an oxide layer of a first thickness. A high voltage device that programs the flash memory devices would be fabricated on a non-cell or peripheral region with an oxide layer of a second thickness, which is much thicker than the first thickness, to achieve desirable device characteristics. These oxide layers would be fabricated by way of the novel techniques described herein as applied to various flash memory cell designs. These designs include, among others, a stacked cell design, a split cell design, and the like. Further details of these flash cell designs are described in more detail below.

Benefits of the various embodiments include the ability to reduce the number of steps of forming gate oxide layers, and protecting the gate oxide layer from contacting photoresist which may include some metal materials which will decay the gate oxide.

The present invention achieves these benefits in the context of known process technology. However, a further understanding of the nature and advantages of the present invention may be realized by reference to the latter portions of the specification and attached drawings.

DESCRIPTION OF THE SPECIFIC EMBODIMENTS

Prior Art Fabrication Methods and EEPROM Structures

Figure 1A:
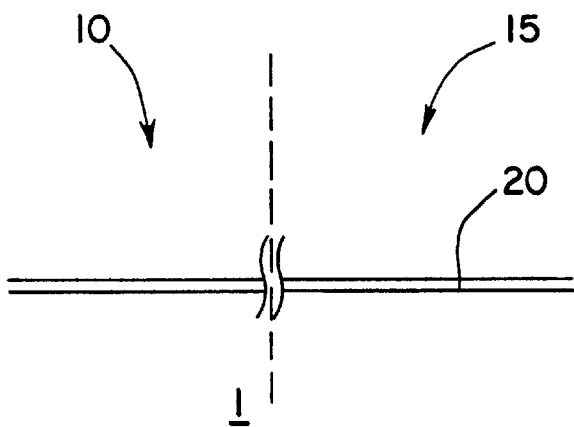
FIGS. 1A–1K are cross-sectional views of simplified prior art fabrication methods for EEPROM semiconductor devices.

A simplified prior art EEPROM fabrication process and related structures may be briefly described as follows with reference to FIGS. 1A–1K. FIGS. 1A–1K are cross-sectional views of a typical prior art method for forming a gate oxide with different thicknesses for a typical EEPROM, e.g., flash EEPROM, device. FIG. 1A shows a semiconductor substrate 1, such as silicon, with a gate oxide layer 20 formed thereon by a first thermal oxidation process. Typically gate oxide layer 20 has a thickness of about 30–250 Å, and is formed by a thermal oxidation process (e.g., subjecting the silicon substrate to an oxygen-containing environment in a thermal oxidation furnace). As seen in FIG. 1A, a cell region 10 and a periphery region 15 for a typical prior art EEPROM device are shown. Each cell in cell region 10 corresponds to a region for storing a bit of information in a EEPROM semiconductor integrated circuit chip. Thousands and even millions of these microscopically small regions make up a core memory area (or active cell area) of the EEPROM chip. Typically in a completed EEPROM chip, cell region 10 will include multiple storage cell transistors (not shown), and periphery region 15 will include peripheral driver transistors, high-voltage power supply circuitry, interconnects and bonding pads, etc. For FIGS. 1A–1K, different regions are shown separated by double wavy lines to indicate the existence of other structures (e.g., isolation structures like isolation trenches or field oxide, etc.) separating the regions.

Figure 1B:
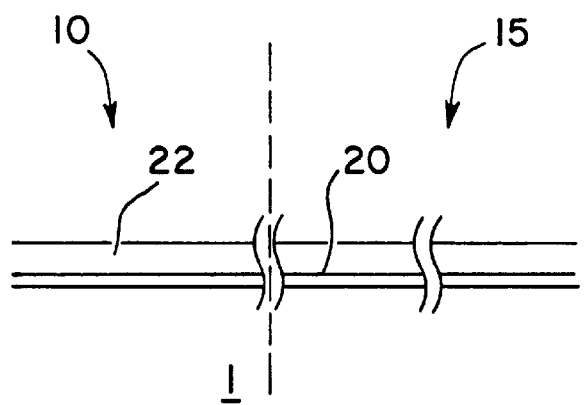
Figure 1C:
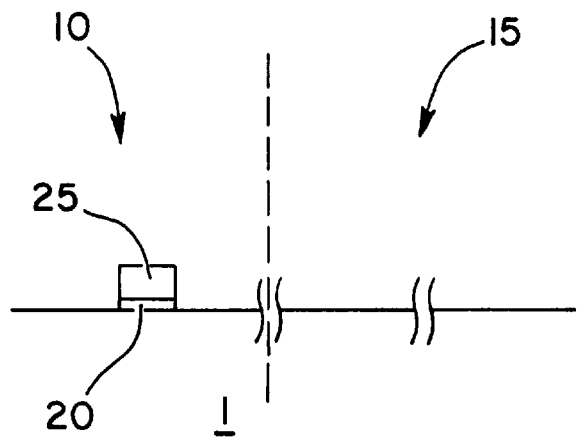

As seen in FIG. 1B, a first conducting layer 22, which may be polysilicon, is formed by chemical vapor deposition over oxide layer 20 which acts as the tunnel oxide in cell region 10. Of course, to improve electrode conductivity, the first conducting layer may be in situ doped or doped subsequent to deposition. Then, a photoresist is formed on first conducting layer 22 and patterned to define a floating gate 25 in cell region 10. Then, an etch step is performed to form the floating gate 25, and the photoresist is removed. Portions of oxide layer 20 not covered by floating gate 25 are also removed when the photoresist is removed. Any remnants of such portions of oxide layer 20 are removed by a pre-clean step following removal of the photoresist.

Figure 1D:
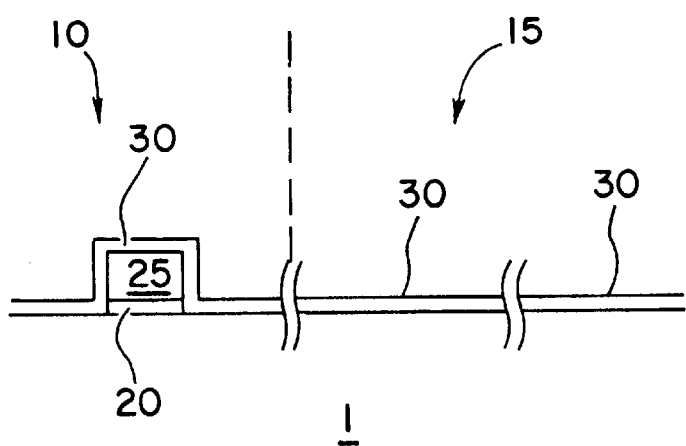
Figure 1E:
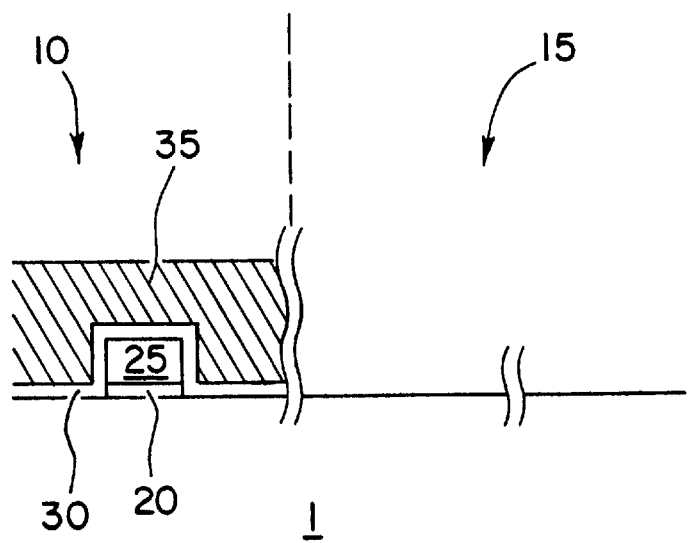

Following formation of floating gate electrode 25, the prior art method forms, e.g., by chemical vapor deposition, an ONO layer 30 over gate electrode 25 and substrate 1, as seen in FIG. 1D. Then, the gate oxide in the periphery region is formed as follows. A photoresist 35 is formed over cell region 10 to mask and protect ONO layer 30 in region 10 from an etch performed to remove ONO layer 30 in periphery region 15, as shown in FIG. 1E.

Figure 1F:
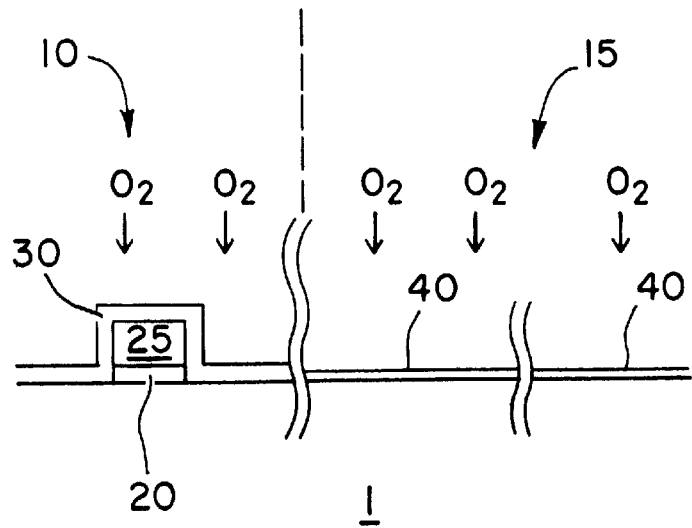

Then, photoresist 35 is removed and a thermal oxidation is performed. As illustrated in FIG. 1F, with ONO layer 30 in cell region 10 serving as a protection mask from the thermal oxidation, the exposed substrate 1 in periphery region 15 becomes thermally oxidized to form a thermal oxide layer 40 having a thickness of about 50–250 Å.

Figure 1G:
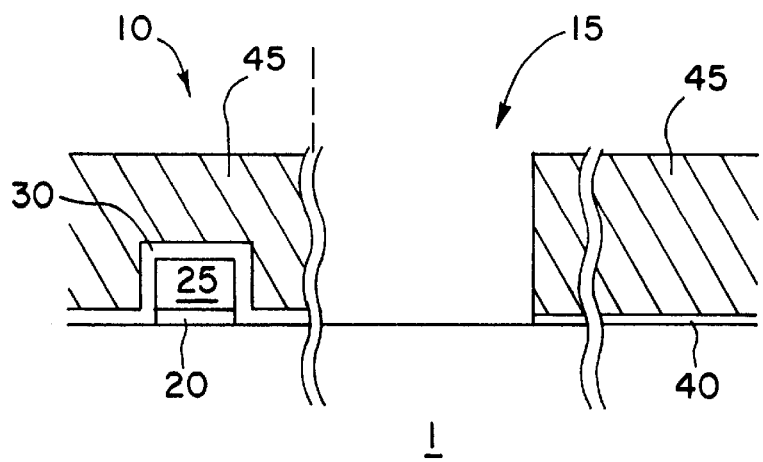

As seen in FIG. 1G, a photoresist 45 is formed and patterned over cell region 10 and over portions of periphery region 15 where a thicker oxide is desired. Photoresist 45 thus protects cell region 10 and a portion of thermal oxide 40 in periphery region 15. Then an etching step is performed using photoresist 45 as a mask, as seen in FIG. 1G, to completely remove the unmasked portion of thermal oxide layer 40 in periphery region 15 where a thinner oxide layer is desired. As mentioned above, the etching step to remove unmasked portions of oxide layer 40 may be either a dry etch or a wet etch. In the prior art method, photoresist 45 physically contacts thermal oxide layer 40 which is to become the thicker gate oxide, while the etch step removes the remaining unmasked portion of thermal oxide 40. The materials used for such photoresist typically contain many contaminants which degrade the ability of the thick gate oxide to resist long-term high voltage stresses.

Figure 1H:
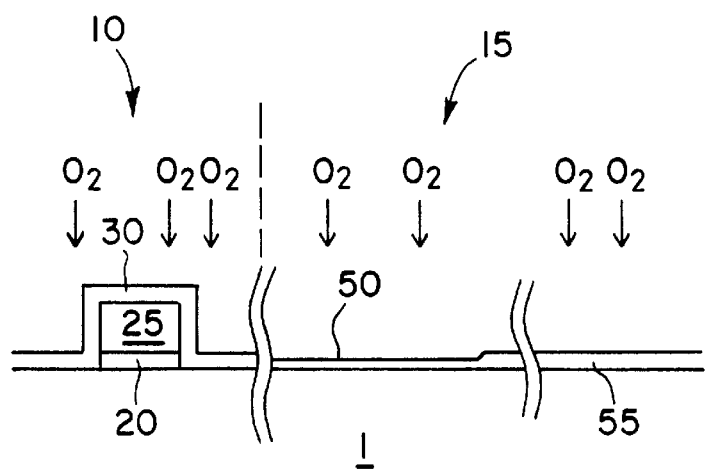

Photoresist 45 is then removed to expose ONO layer 30 in cell region 10, a portion of substrate 1 in periphery region, and the remaining portion of oxide layer 40 in periphery region 15. Then, another thermal oxidation is performed, as shown in FIG. 1H. With ONO layer 30 in cell region 10 again serving as a protection mask from the thermal oxidation, the exposed substrate I in a portion of periphery region 15 becomes thermally oxidized to form a thermal oxide layer 50 having a thickness of about 30–250 Å. Thermal oxide 40 in a portion of periphery region 15 also becomes further thermally oxidized to form a thicker thermal oxide layer 55 having a thickness of about 100–500 Å.

Figure 1I:
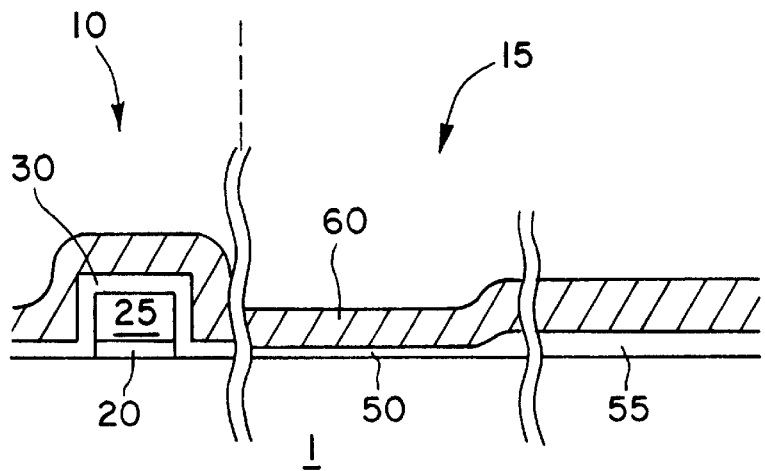
Figure 1J:
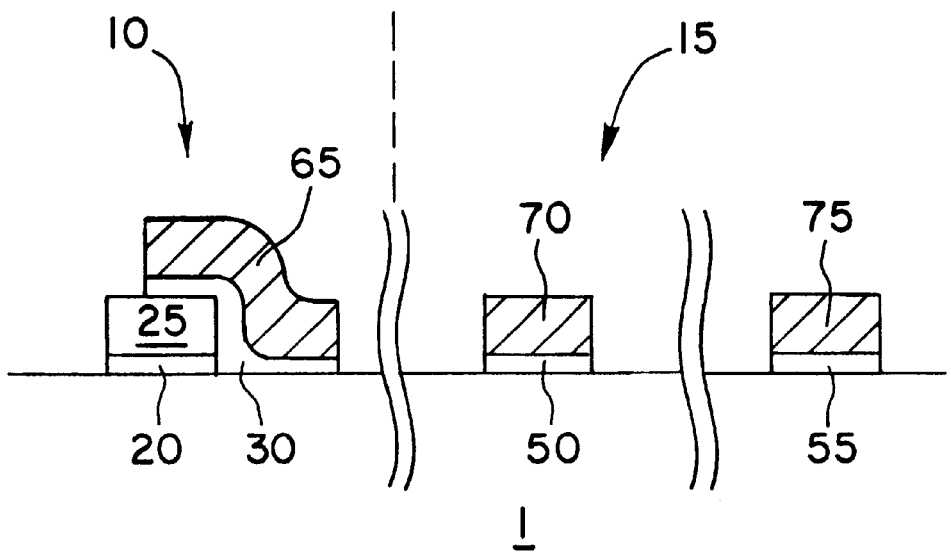
Figure 1K:
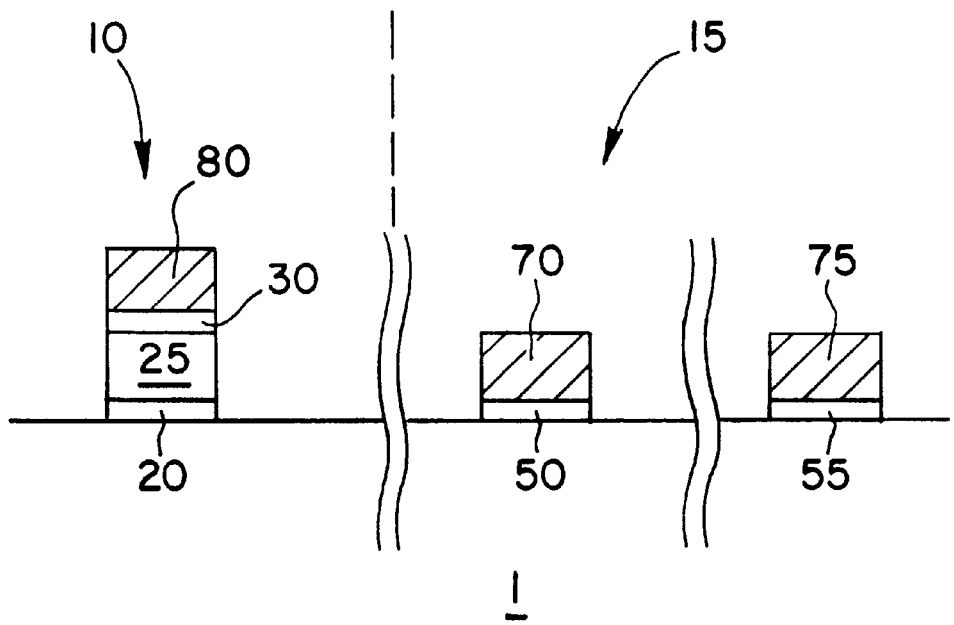

Following the thermal oxidation, a second conducting layer (e.g., polysilicon) is formed using chemical vapor deposition over ONO layer 30 in cell region 10, and over thermal oxide layer 50 and thicker thermal oxide layer 55 in periphery region 15, as seen in FIG. 1I. Of course, to improve electrode conductivity, the second conducting layer may be in situ doped or doped subsequent to deposition. Second conducting layer is then masked and patterned, and etched to form additional gate electrodes in the cell region 10 and in the periphery region 15, as seen in FIGS. 1J and 1K which show alternative embodiments of partially completed typical prior art flash EEPROMs. Although not shown, source/drain regions and lightly-doped drain (LDD) regions for the transistors also are formed. As seen in FIG. 1J, in cell region 10, a control gate electrode 65 is formed over part of ONO layer 30 on floating gate electrode 25 and over part of ONO layer 30 on substrate 1 for a "split gate" cell. In addition, in periphery region 15, a gate electrode 70 is formed over thin oxide layer 50 and a gate electrode 75 is formed over thicker oxide layer 55. FIG. 1K similarly shows the formation of gate electrodes 70 and 75, but shows in cell region 10 the formation of a control gate electrode 80 formed on top of ONO layer 30 on floating gate electrode 25 for a "stack gate" cell. Accordingly, the prior art method forms two different thicknesses for the gate oxide. To form a complete EEPROM device, additional steps besides those described above would be performed.

Improved Methods for Fabricating EEPROMs

The present invention provides improved and more efficient methods for fabricating EEPROMs with different gate oxide thicknesses. A method according to the present invention may be briefly outlined as follows:

(1) Providing a substrate having a memory device or cell region, a MOS device region, and a high voltage region;

(2) Forming a dielectric layer overlying the memory device region and the MOS device region and high voltage region;

(3) Selectively forming a first gate electrode overlying the dielectric layer in the memory device region and a MOS transistor gate electrode overlying the MOS device region;

(4) Forming an oxide-nitride-oxide ("ONO") layer (i.e., interpoly dielectric layer) overlying the first gate electrode, the MOS transistor gate, and parts of the substrate;

(5) Selectively removing the ONO layer and dielectric layer from the high voltage region of the periphery region;

(6) Forming a thick dielectric layer overlying the high voltage region;

(7) Selectively forming a second gate electrode overlying the first gate electrode and a high voltage gate overlying the thick dielectric layer; and (8) Performing remaining fabrication steps as necessary.

The above sequence of steps illustrate a simplified method according to the present invention. As can be seen, this method forms an outer film of dielectric material, which is often thicker, for a high voltage MOS transistor or device after formation of an interpoly dielectric layer for a flash memory cell or device. Since the second thicker dielectric material is defined without requiring contact with a photoresist, the thicker dielectric material is often cleaner and substantially free from any photoresist impurities. Accordingly, this sequence of steps provides a high voltage device, which is often more reliable and has better quality than those made by way of pre-existing techniques. Details regarding to embodiments of the present method or methods are described in more detail below.

The present invention provides improved methods for fabricating EEPROMs with different gate oxide thicknesses. FIGS. 2A–2I illustrate improved methods of fabricating a gate oxide with different thicknesses for EEPROM devices, e.g., flash EEPROMs, according to specific embodiments of the present invention. The embodiments are shown for illustrative purposes only, and therefore should not limit the scope of the invention, as recited by the claims.

Figure 2A:
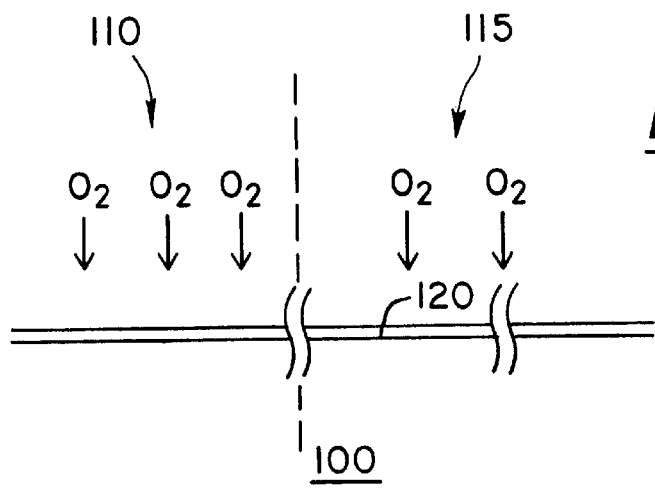
FIGS. 2A–2E are cross-sectional views of simplified fabrication methods for EEPROM semiconductor devices, in accordance with embodiments of the present invention.

FIG. 2A shows a semiconductor substrate 100, such as silicon, with a gate oxide layer 120 formed thereon by a first thermal oxidation process. In accordance with a specific embodiment, gate oxide layer 120 has a thickness of about 30–150 Å for a gate width of about 0.45–0.5 μm, about 70 Å for a gate width of about 0.35 μm. Gate oxide layer 120 with such thicknesses may be formed by subjecting the silicon substrate 100 to an oxygen-containing environment in a thermal oxidation furnace at about 850° C. and about 760 torr for about 30 minutes, or by chemical vapor deposition. As seen in FIG. 2A, a cell region 110 and a periphery region 115 for an EEPROM device according to the present invention are shown. Cell region 110 will include multiple storage cell transistors (not shown), and periphery region 115 will include peripheral driver transistors, high-voltage power supply circuitry, interconnects and bonding pads, etc. For FIGS. 2A–2I, different regions are shown separated by double wavy lines to indicate the existence of other structures (e.g., isolation structures like isolation trenches or field oxide, etc.) separating the regions.

Figure 2B:
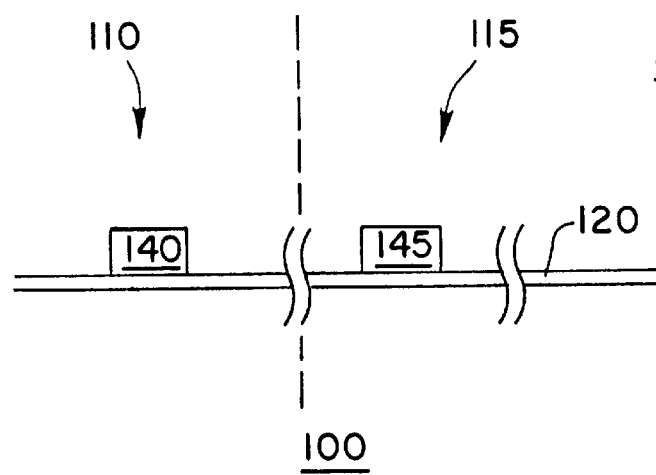
Figure 2C:
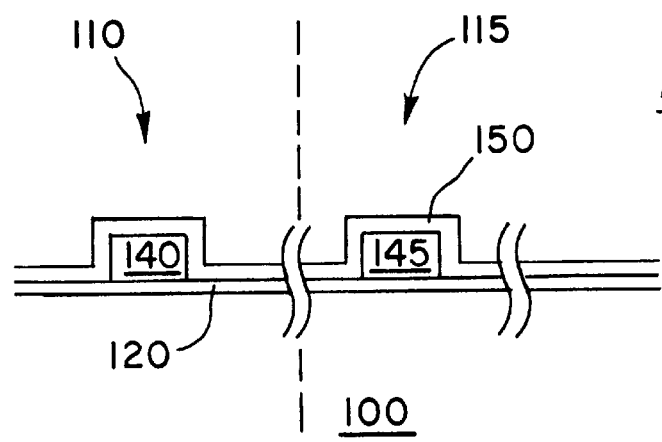
Figure 2D:
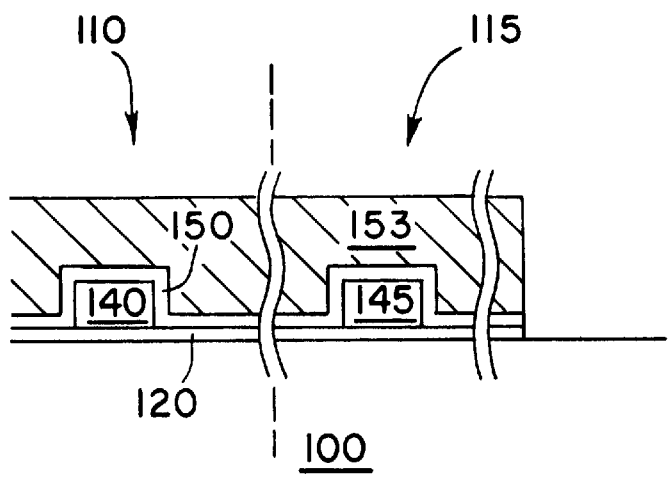

A first conducting layer (e.g., polysilicon) is deposited, masked and patterned, and etched to form a floating gate electrode 140 in the cell region 110 and a gate electrode 145 in the periphery region 115, as shown in FIG. 2B. Of course, to improve electrode conductivity, the first conducting layer may be in situ doped or doped subsequent to deposition. Then, as shown in FIG. 2C, an interpoly dielectric layer 150, such as ONO, is deposited, e.g., by chemical vapor deposition, over the gate electrodes 140 and 145 and over the exposed portions of dielectric layer on the substrate. Layer 150 is then covered with a mask 153 that is patterned, as seen in FIG. 2D. In areas where the dielectric layer 150 and oxide layer 120 are exposed by mask 153, layers 150 and 120 are then etched away, as illustrated in FIG. 2D, where a thicker gate oxide is required, such as in the high voltage area of periphery region 115. Mask 153 is then removed, as shown in FIG. 2E.

Figure 2E:
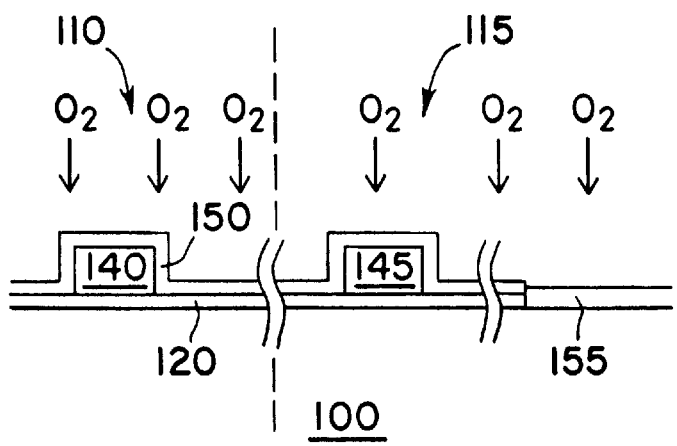

Then, with ONO layer 150 in cell region 110 and a portion of periphery region 115 serving as a protection mask from the thermal oxidation, a second thermal oxidation is performed to form a thicker oxide layer 155 in the exposed part of the periphery region 115, as seen in FIG. 2E. Thin oxide layer 120, which is protected by the ONO layer 150 from the oxidation, thus remains thin compared to thicker oxide layer 155. In the present invention, gate oxide layer 120 is used as the thin gate oxide layer (as a tunneling oxide) for the cell region 110 and (as a thin gate oxide layer) for part of the periphery region 115. According to specific embodiments, the thick gate oxide 155 grown has a thickness of about 100–500 Å, and may be formed by thermal oxidation at about 850° C. and about 760 torr for about 30 minutes or more in a thermal oxidation furnace using oxygen-containing gas. Accordingly, the present method forms two different thicknesses for the gate oxide, without subjecting the gate oxide to any contact with a contaminant-containing photoresist.

Figure 2F:
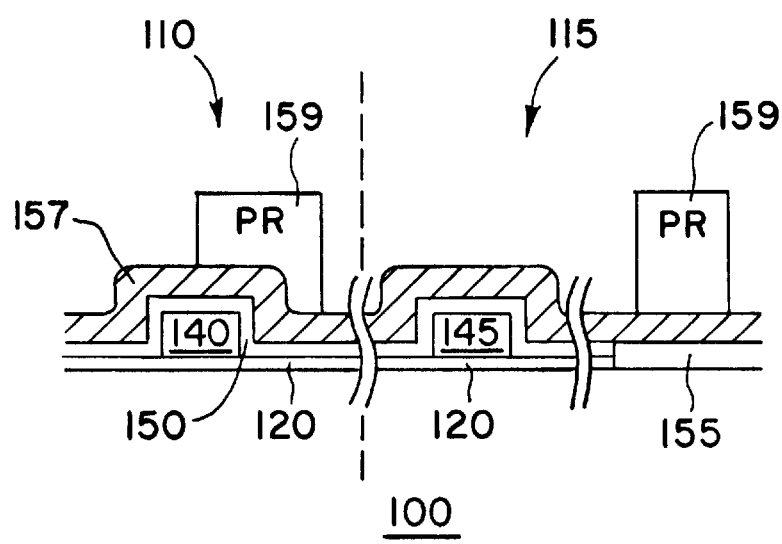
FIGS. 2F–2G and FIGS. 2H–2I illustrate partially-completed EEPROM devices formed for alternative embodiments in accordance with FIGS. 2A–2E.
Figure 2G:
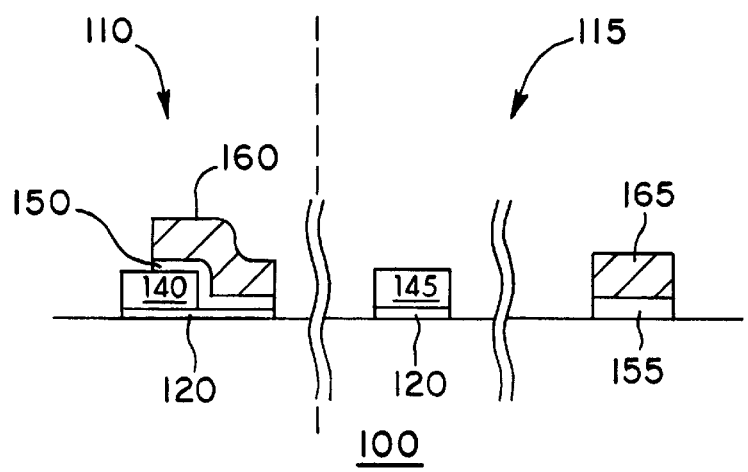
Figure 2H:
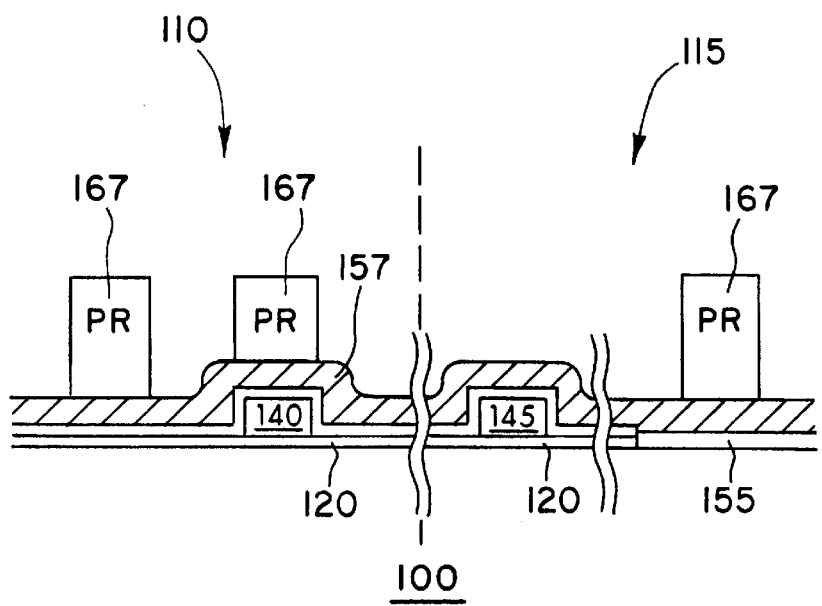
Figure 2I:
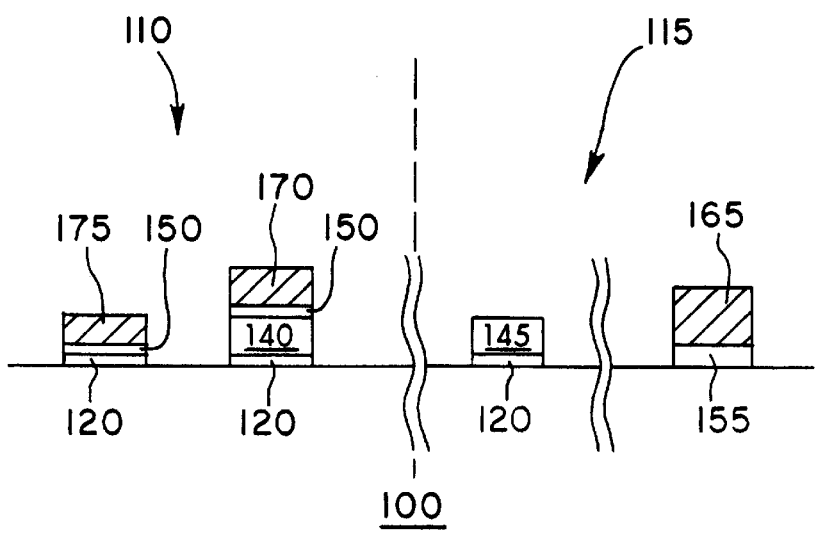

FIGS. 2F–2G and FIGS. 2H–2I show alternative embodiments of partially completed EEPROMs in accordance with the present invention. As shown in FIG. 2F, a second conducting layer 157 (e.g., polysilicon) is deposited and masked with a photoresist 159, which is then patterned. Then, the second conducting layer 157 is etched to form a control gate electrode 160 of a "split gate" cell in the cell region 110 and a gate electrode 165 in the periphery region 115, as shown in FIG. 2G. Thus, the gates 160 and 165 of second conducting layer in the split gate cell embodiment may be patterned simultaneously. In accordance with an alternative embodiment, FIG. 2H shows second conducting layer 157 (e.g., polysilicon) that is deposited, masked with a photoresist 167 and patterned. Then, as shown in FIG. 2I, the second conducting layer 157 is etched to form a control gate electrode 170 of a "stack gate" cell in the cell region 110, a gate electrode 175 in the cell region 110, and a gate electrode 165 in the periphery region 115. In the stack gate cell embodiment, the second conducting layer in the cell region 110 and in the periphery region 115 may also need to be separately patterned and etched to form gate electrodes 170, 175 and 165. In the various embodiments, to improve electrode conductivity, the second conducting layer also may be in situ doped or doped subsequent to deposition. In the embodiments discussed above for FIGS. 2A–2I, the gate electrode includes a thickness of polysilicon ranging from about 300–3000 Å. Of course, the thickness of the gate electrode layer depends on the particular application. The gate electrode may also be a silicide gate, polycide gate, or the like, and combinations thereof. The silicide may be selected from refracting metal combinations such as $WSi_2$, $TaSi_2$, $TiSi_2$, $CoSi_2$, $MoSi_2$, among others. To form a complete EEPROM device, additional steps besides those described above would be performed. For example, although not shown, source/drain regions and lightly-doped drain ("LDD") regions for the transistors also are formed. Although the above description of the specific embodiments of the present invention discuss gate electrode 140 as a floating gate electrode and gate electrodes 160 and 170 as control gate electrodes in the typical device, it should be recognized that the gate electrode formed in the cell region from the first conducting layer and the gate electrodes formed from the second conducting layer may be different gate electrodes (e.g., gate electrode 140 may be a control gate electrode or erase gate electrode, and/or gate electrodes 160 and 170 may be floating gate electrodes or erase gate electrodes), depending on the specific type of device being fabricated.

In a further aspect of the present invention, the techniques described above can be applied to a variety of devices structures and cell designs. As merely an example, selected flash EEPROM devices can be defined in a cell region having an oxide of a first thickness, which is thin enough to be a gate oxide, for example. Peripheral or high voltage regions can be defined on an oxide of a second thickness that is much thicker than the first thickness to achieve desired device performance. The first oxide thickness and the second oxide thickness is defined using the techniques described herein. Details of the use of the techniques as applied to the selected EEPROM devices are described in more detail below.

Although the above-described methods of FIGS. 2A–2I according to specific embodiments of the present invention describe the formation of a thicker oxide layer 155 in periphery region 115 and thin oxide layer 120 in both periphery region 115 and cell region 110, it should be recognized that a thicker oxide layer also may be formed in cell region 110 in other specific embodiments. Exemplary flash EEPROM devices in which the method of the present invention may be used to implement differential gate oxide thickness are described below.

Figure 3:
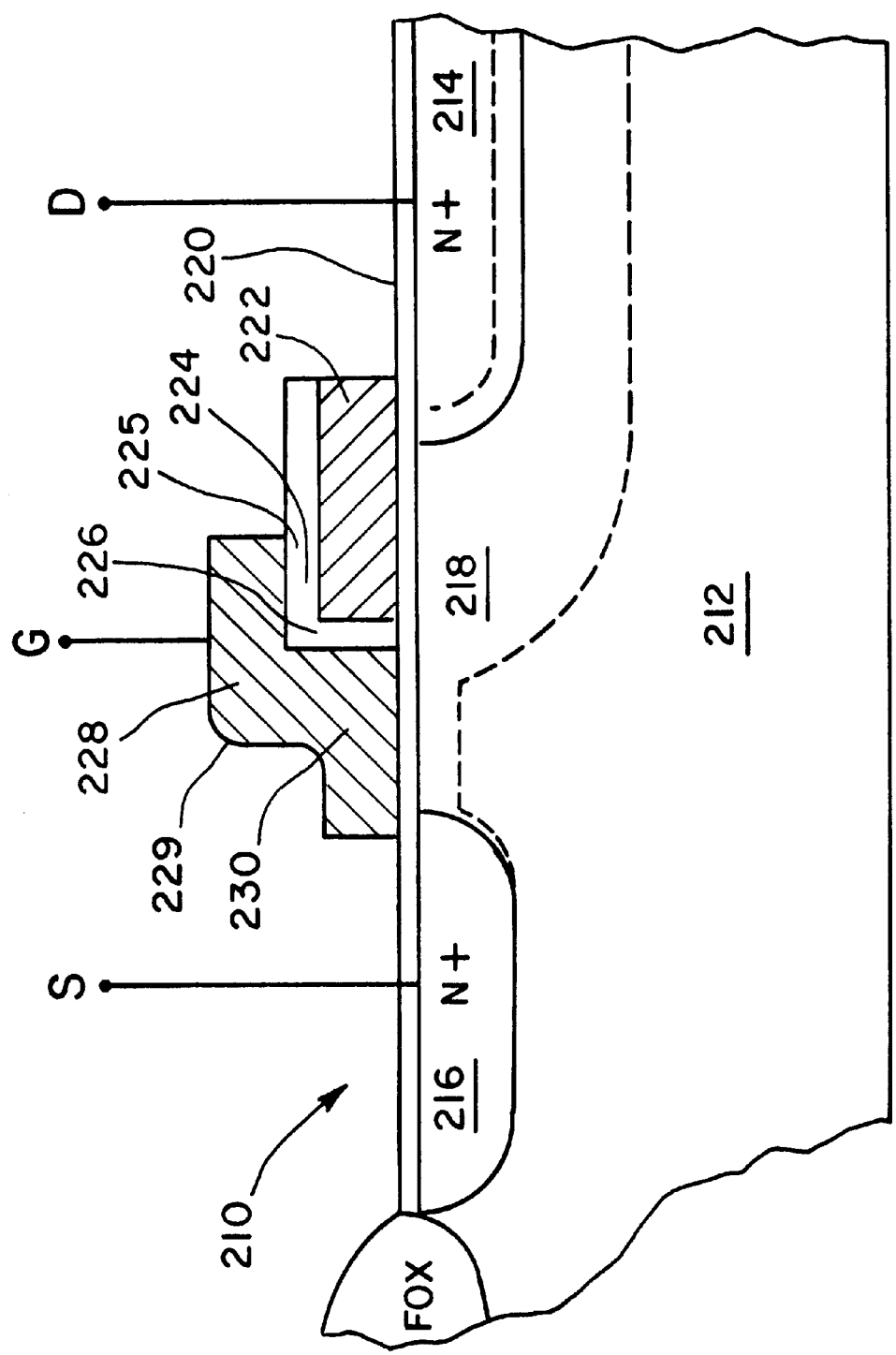
FIG. 3, illustrates a flash memory cell 210 in a partially completed EEPROM device formed in accordance with the method of FIGS. 2A–2G, according to a specific embodiment of the present invention.

FIG. 3 illustrates an example of a memory cell in a flash memory device according to a specific embodiment of the present invention. Referring to FIG. 3, there is shown a single transistor non-volatile electrically alterable semiconductor memory cell 210, which will be defined on an oxide layer of a first thickness. The cell 210 comprises a semiconductor substrate 212, such as silicon. The substrate 212, in one embodiment, can be a P-type silicon substrate with a typical doping level range from 5 to 50 Ω-cm, depending on the level of scaling.

Within the substrate 212 are defined a source region 216 and a drain region 214 with a channel region 218 therebetween. Disposed over the source region 216, channel region 218, and drain region 214 is a first layer 220 of insulating material, on the order of, e.g., 70–200 Å angstrom of thickness. The first layer of insulating material would be the first oxide having the first thickness. Although FIG. 3 illustrates a cell region of an exemplary device without showing the periphery region which can include an oxide layer thicker than oxide layer 220, the above-described methods of the present invention may be used to form the different thickness oxide layers.

Disposed over the first layer 220 is a floating gate 222. The floating gate 222 is positioned over a portion of the channel region 218 and over a portion of the drain region 214. The floating gate 222 can be a polysilicon gate and in one embodiment is a re-crystallized polysilicon gate. A second insulating layer 225 has a first portion 224 disposed over the floating gate 222 and a second portion 226 disposed adjacent to the floating gate 222. The first portion 224 (top wall 224) of the second layer 225 is an insulating material and can be silicon dioxide, silicon nitride or silicon oxynitride and is on the order of, e.g., 1000–3000 Å in thickness. The second portion 226 (side wall 226) of the second layer 225 is also of an insulating material and can be silicon dioxide, silicon nitride or silicon oxynitride and is on the order of, e.g., 150–1200 Å in thickness. A control gate 229 has two portions: a first portion 228 that is disposed over the top wall 224 of the second layer 225; and a second portion 230 that is disposed over the first layer 220 and is immediately adjacent to the side wall 226 of the second layer 225. The second portion 230 of the control gate 229 extends over a portion of the source region 216 and over a portion of the channel region 218.

The dimensions of the cell 210 depend upon the process used. Thus, the foregoing dimensions for the first layer 220, side wall 226, and top wall 224 are only illustrative examples. Further, the materials, for the first layer 220 and the second layer 225 are also illustrative examples only. In general, however, the dimensions of the cell 210 are such that electrons emanating from the source region 216 are injected onto the floating gate 222 by sensing an abrupt potential drop. Further, the dimensions of cell 210 are such that negative charges from the floating gate 222 are removed by tunneling through the Fowler-Nordheim mechanism through the second layer 225 onto the control gate 229.

The particular manner of operating the cell 210 is as follows. Initially, when it is desired to erase cell 210, a ground potential is applied to the drain 214 and to the source 216. A high-positive voltage, on the order of, e.g., +15 volts, is applied to the control gate 229. Negative charges on the floating gate 222 are induced through the Fowler-Nordheim tunneling mechanism to tunnel through the second layer 225 to the control gate 229, leaving the floating gate 222 positively charged.

When selective cells 210 are desired to be programmed, a ground potential is applied to the source region 216. A positive voltage level, in the vicinity of the threshold voltage of the MOS structure defined by the control gate 229 (on the order of approximately of +1 volt, for example), is applied to the control gate 229. A positive high voltage, on the order of, e.g., +12 volts, is applied to the drain region 214. Electrons generated by the source region 216 will flow from the source region 216 towards the drain region 214 through a weakly-inverted channel region 218. When the electrons reach the region where the control gate 229 meets the side wall 226, the electrons see a steep potential difference approximately equal to the drain voltage, across the surface region defined by the gap of the side wall 226. The electrons will accelerate and become heated and some of them will be injected into and through the first insulating layer 220 onto the floating gate 222.

The injection of electrons onto the floating gate 222 will continue until the charged floating gate 222 can no longer sustain a high surface potential beneath, to generate hot electrons. At that point, the electrons or the negative charges in the floating gate 222 will "turn off" the electrons from flowing from the source region 216 onto the floating gate 222.

Finally, in a read cycle, ground potential is applied to the source region 216. Conventional transistor read voltage, such as +2 volts and +5 volts, are applied to the drain region 214 and to the control gate 229, respectively. If the floating gate 222 is positively charged (i.e., the floating gate is discharged), then the channel region 218 directly beneath the floating gate 222 is turned on. When the control gate 229 is raised to the read potential, the region of the channel region 218 directly beneath the second portion 230 is also turned on. Thus, the entire channel region will be turned on, causing electrical current to flow from the drain region 214 to the source region 216. This would be the "1" state.

On the other hand, if the floating gate 222 is negatively charged, the channel region 218 directly beneath the floating gate 222 is either weakly turned on or is entirely shut off. Even when the control gate 229 and the drain region 214 are raised to the read potential, little or no current will flow through the portion of the channel region directly beneath the floating gate 222. In this case, either the current is very small compared to that of the "1" state or there is no current at all. In this manner, the cell 210 is sensed to be programmed at the "0" state.

The device of FIG. 3 is commonly programmed by way of a high voltage device, which applies a high voltage to selected regions of the device to introduce electrons into the floating gate, for example. The high voltage device is often defined in a peripheral or non-cell region of the semiconductor integrated circuit. In a specific embodiment, the high voltage device is fabricated on an oxide layer of a second thickness, which is much thicker than the first thickness. The oxide of first thickness and second thickness can be formed using the techniques described above according to a preferred embodiment of the present invention.

Figure 4:
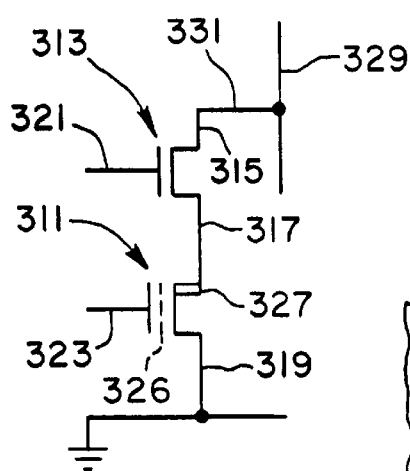
FIG. 4 is a schematic circuit diagram of a memory cell in a partially completed EEPROM device formed in accordance with FIGS. 2A–2E and 2H–2I, according to another specific embodiment of the present invention.

In accordance with another specific embodiment of the present invention, FIG. 4 is a schematic circuit diagram of a memory cell, which can be a memory cell using the differential oxide thicknesses of the present invention. In particular, the memory cell of the circuit diagram uses the oxide of first thickness which is much thinner than the oxide of the second thickness. With reference to FIG. 4, a memory cell of the present invention includes a memory device 311 and a field effect transistor 313 which allows selection of memory device 311 from among other memory cells. A drain 315 of selection transistor 313 is connected via a metal contact 331 to a read line 329. Selection transistor 313 and memory device 311 are connected together in series at a node 317 which serves as both a source for selection transistor 313 and a drain for memory device 311. A source 319 of memory device 311 connects to a common source line which in turn is coupled to ground. The gate 321 of selection transistor 313 is electrically connected to a word select line. The control gate 323 of memory device 311 is connected to a sense enable and program line. The circuit of FIG. 4 also includes in the memory device 311 a floating gate 326 (as represented in FIG. 4 by a dashed line), separated from the substrate by only a thin oxide layer. A program and erase implant 327 is provided in memory device 311 proximate to the device 317. The thin oxide layer together with the program and erase implant 327 permit rapid erasure of the memory device 311 electrically in a few milliseconds, instead of the usual twenty minutes or so with ultra-violet (UV) light with the thicker oxide layer under the floating gate of prior memory devices. The implant 327 also enables more efficient reprogramming to occur.

Figure 5:
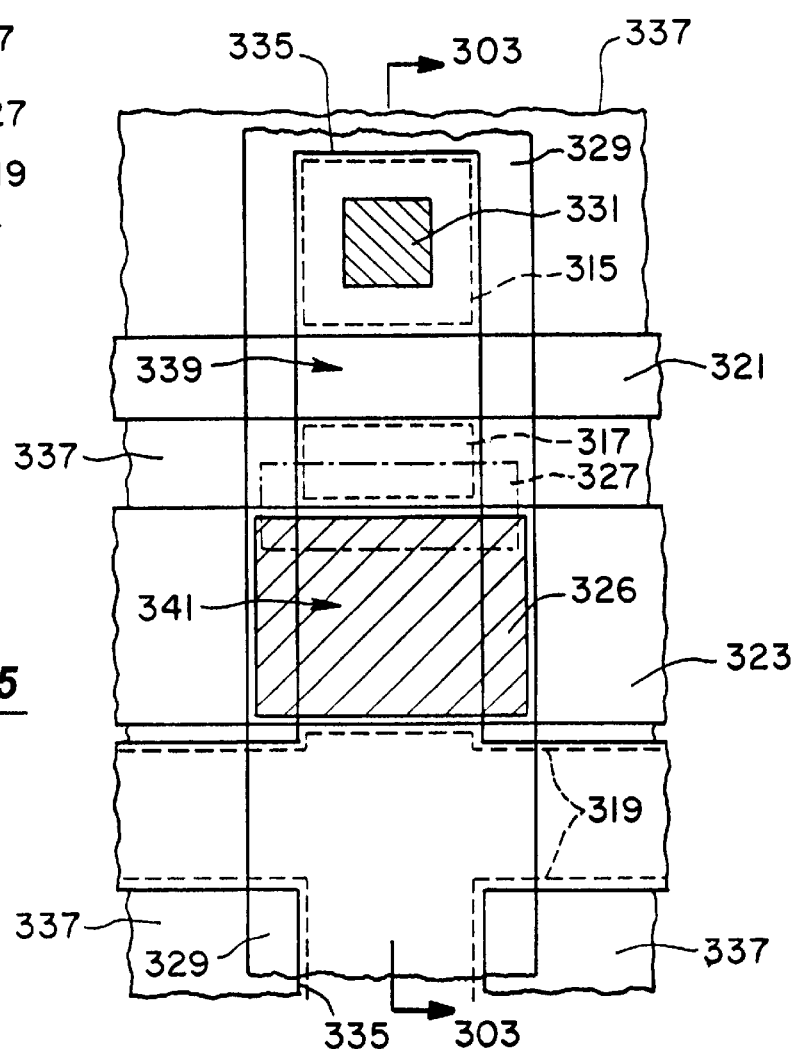
FIG. 5 is a top plan view of the memory cell of FIG. 4.
Figure 6:
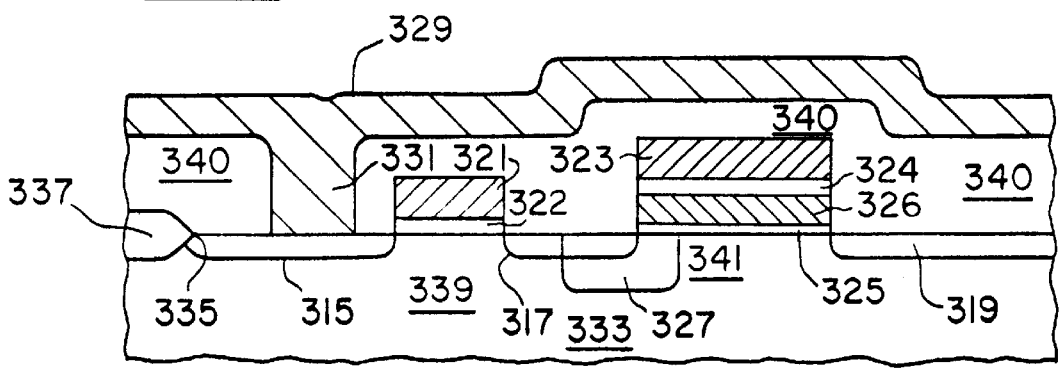
FIG. 6 is a side cross-sectional view taken along the line 303—303 in FIG. 5.

FIG. 5 is a top plan view of the memory cell of FIG. 4, and FIG. 6 is a side cross-sectional view taken along the line 303—303 in FIG. 5. With reference to FIGS. 5 and 6, a semiconductor chip having an array of memory cells comprises a semiconductor substrate 333 with active memory areas 335 therein. A field isolation oxide layer 337 is present over all non-active areas outside of memory areas 335. Three spaced-apart implants 315, 317 and 319 are located in memory area 335 with channel areas 339 and 341 defined therebetween. Implant 315 forms a drain for the selection transistor 313 in the circuit of FIG. 4. Implant 317 forms a node functioning as both a source for selection transistor 313 and a drain for memory device 311 in FIG. 4. Implant 319 forms a source for memory device 311. Typically, substrate 333 is P-type and implants 315, 317 and 319 are N-type.

A program and erase implant 327 is also present in the active memory area 335 of substrate 333. Implant 327 overlaps part of node implant 317, extending into channel 341 between implants 317 and 319 of the memory device 311. Implant 327 is typically N-type and may be formed by either phosphorus or arsenic ion implantation followed by diffusion, as explained below. A thin oxide layer 325 is disposed over channel 341 between implants 317 and 319, including over the portion of program and erase implant 327 which extends into channel 341, in active area 335. Typically, thin oxide layer 325 is between 70–150 Å thick. The remainder of active area 335 between field oxide layer 337 has an oxide layer 322 over it. Oxide layer 322 is thicker than thin oxide layer 325, typically about 300–500 Å thick. It is recognized that the above-described methods of the present invention can be used to form thin oxide layer 325 and thicker oxide layer 322 within the cell region of the exemplary device.

A polysilicon floating gate 326 is disposed on thin oxide layer 325 and extends over that portion of program and erase implant 327 that is beneath thin oxide layer 325.

An interpoly oxide layer 324 is disposed on floating gate 326 and a polysilicon sense gate 323 is situated above interpoly oxide layer 324. A polysilicon select gate 321 is disposed above channel 337 between implants 315 and 317. The entire wafer is covered with an insulating glass layer 339 with vias for contacts 331 therein. A layer of conductive lines 329 is disposed on top of glass layer 340.

Similar to the previous embodiment, the device of FIGS. 4–6 are commonly programmed by way of a high voltage device, which applies a high voltage to selected regions of the device to introduce electrons into the floating gate, for example. The high voltage device is often defined in a peripheral or non-cell region of the semiconductor integrated circuit. In a specific embodiment, the high voltage is fabricated on an oxide layer of a second thickness, which is much thicker than the first thickness. The oxide of first thickness and second thickness can be formed using the techniques described above according to a preferred embodiment of the present invention.

Figure 7:
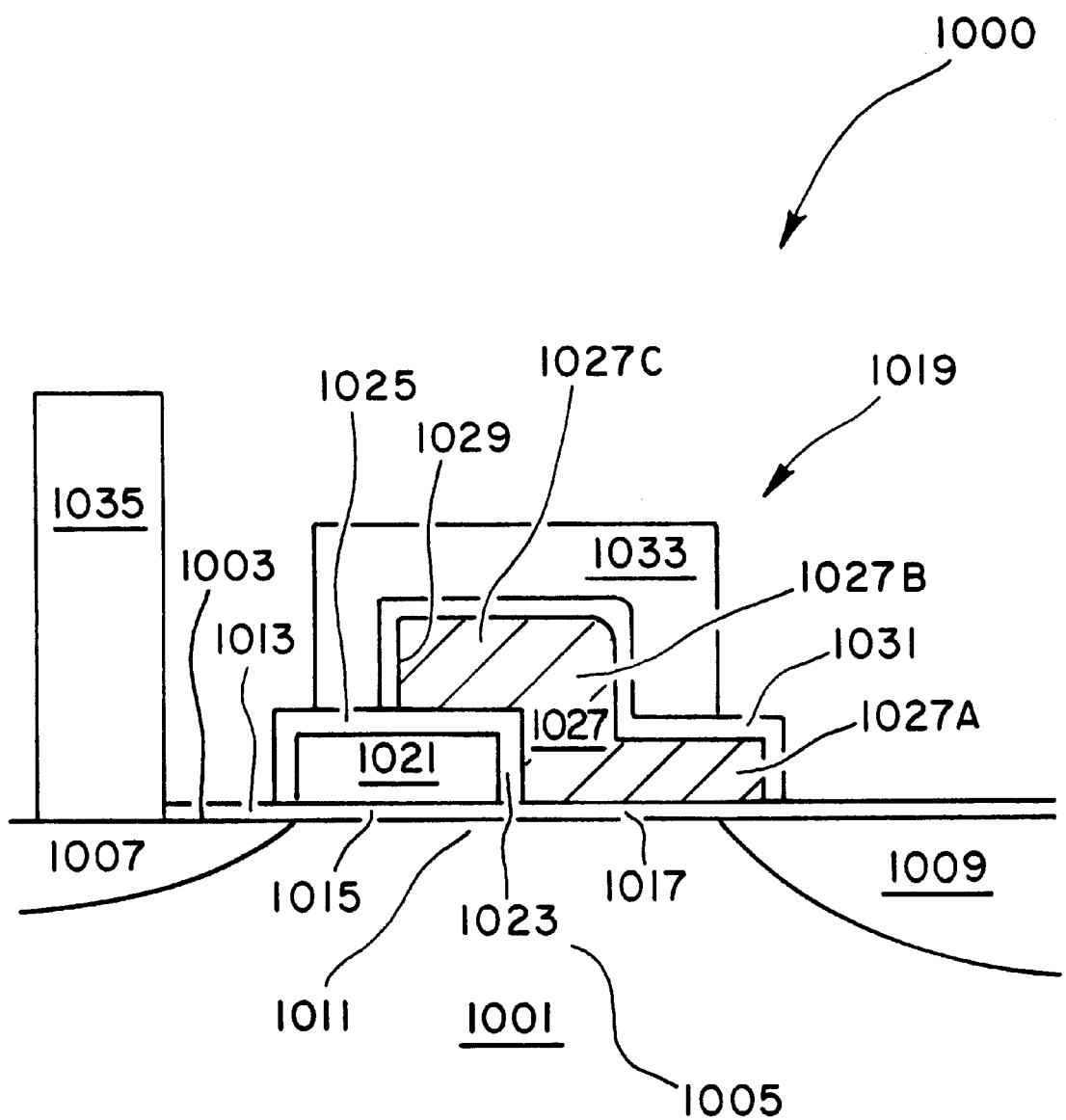
FIG. 7 illustrates an improved flash memory cell 1000 in a partially completed EEPROM device formed in accordance with FIGS. 2A–2E, according to still another specific embodiment of the present invention.

In another specific embodiment, the present invention differential oxide thickness technique can also be applied to an improved flash memory cell 1000, such as the one shown in the simplified diagram of the FIG. 7. This diagram is merely an illustration and should not limit the scope of the claims. One of ordinary skill in the art would recognize other variations, alternatives, and modifications. Memory cell 1000 is defined in substrate 1001, which includes an upper surface 1003 that is substantially planar in geometry. A well region 1005 is defined in the substrate. The well region 1005 has a drain region 1007 and a source region 1009. In some embodiments, the drain region is a common drain region, which is shared by another memory cell. Similarly, the source region can be a common source region, which is shared by another memory cell. Between the source region and the drain region is a channel region 1011. The source and drain regions are made using implantation techniques, but can also be made using plasma immersion ion implantation or the like. A dielectric layer 1013, including a gate dielectric layer 1015 and a tunnel dielectric layer 1017, is defined overlying the channel region 1011. These dielectric layers can be made using a suitable material including silicon dioxide, silicon nitride, silicon oxynitride, and others. In the context of this embodiment, the gate dielectric and tunnel dielectric layers are made of high quality silicon dioxide. The tunnel dielectric layer is substantially uniform and substantially pinhole free. Additionally, the tunnel dielectric layer can withstand numerous programming and erase cycles. Preferably, the tunnel dielectric layer is defined or made using the technique described above. In particular, the tunnel dielectric layer is an oxide layer of a first thickness. This oxide layer of first thickness is much thinner than a second oxide layer of second thickness, which is commonly used in a peripheral or non-cell region of the device. In a specific embodiment, the oxide layer of second thickness is used, for example, for a high voltage device. The high voltage device, which is described in more detail below, injects electrons into the floating gate for programming purposes, for example.

The memory cell 1000 also includes a novel gate structure 1019. In particular, the gate structure 1019 includes a select gate 1021, which is defined from a first polysilicon layer, e.g., poly-1. The select gate is made from a polysilicon layer that is doped using N-type impurities. In some embodiments, the impurities are diffused using a $POCl_3$ compound or the like. Alternatively, the split gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer. The select gate overlies gate oxide and extends to the drain region. A sidewall spacer 1023 and an overlying insulating layer 1025 are defined overlying the select gate. The sidewall spacer and the insulating layer insulate and isolate the select gate from overlying circuit elements, e.g, control gate, floating gate. The select gate also has a channel region ranging from about 0.2 $\mu$m and less, or about 1.0 $\mu$m and less, but is not limited to these ranges. Additionally, the select gate has a thickness of about 500 Å and less, or about 3500 Å and less, but is not limited to these ranges.

The gate structure 1019 also includes a split floating gate 1027 overlying a portion of the upper surface of the substantially planar substrate, and also overlaps a portion of the select gate, which is defined overlying the planar surface of the substrate. That is, the split floating gate is defined overlying insulating layer 1025, which forms overlying the top surface of the select gate. The split gate also overlies an edge(s) including sidewall spacer 1023 of the select gate. The split gate 1027 also has an edge 1029 overlying a region on the top surface of the select gate. Split floating gate 1027 also extends from the select gate to a region overlying tunnel dielectric layer 1017 and extends to source region 1009. Accordingly, the split gate has at least three regions, including a lower horizontal region 1027A overlying the planar surface (which includes the tunnel oxide and the source/drain region), a vertical region 1027B overlying an edge or sidewall spacer of the select gate, and an upper horizontal region 1027C overlying the top surface of the select gate.

The lower horizontal region 1027A, the vertical region 1027B, and the upper horizontal region 1027C define the split gate structure.

The split gate 1027 can be made of any suitable material such as, for example, polysilicon, e.g., poly-2. In most embodiments, the split gate is made from a polysilicon layer that is doped using N-type impurities. In some embodiments, the impurities are diffused using a $POCl_3$ compound or the like. Alternatively, the floating gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A dielectric layer(s) 1031 is defined overlying the floating gate. The dielectric layer forms along edges of the floating gate, which are over the select gate. Additionally, the dielectric layer overlies the top surface of the upper horizontal region, overlies an outer surface of the vertical region, and extends over the lower horizontal region of the floating gate structure. Of course, the type of dielectric layer used depends highly upon the size and shape of the floating gate and control gate. The dielectric layer 1031 can be any suitable layer or combinations of layers such as an oxide-on-nitride-on-oxide, which is commonly termed "ONO." The dielectric layer can also be a single nitride layer or a single oxide layer depending upon the application. Either CVD or thermal techniques can be used to form the dielectric layer or layers. The dielectric layer insulates and isolates the floating gate from a control gate 1033.

Control gate 1033 forms overlying the dielectric layer 1031, which is sandwiched between the floating gate and the control gate. The control gate is defined overlying edge 1029 of the floating gate, which is over a top portion of the select gate. The control gate also forms overlying the upper horizontal region, the vertical region, and the lower horizontal region of the floating gate. The control gate can be made of any suitable material such as, for example, polysilicon, e.g., poly-3. In most embodiments, the control gate is made from a polysilicon layer that is doped using N-type impurities. In some embodiments, the impurities are diffused using a $POCl_3$ compound or the like. Alternatively, the control gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A contact 1035 is defined overlying the drain region. Contacts are also defined on the select gate, the control gate, and the source region. These contacts can be made using a variety of techniques. For example, the contacts can be made using a combination of metals such as aluminum with a barrier metal such as titanium nitride, titanium tungsten, and others. Alternatively, the contacts can be made using a tungsten layer or copper layer with a barrier metal. Furthermore, the contacts can be made from "plugs" such as tungsten plugs, polysilicon plugs, aluminum plugs, and the like. The plugs can be used with or without a barrier layer, or can also be grown in a selective manner. Of course, the type of contacts used depends highly upon the application.

In the present embodiment, the gate coupling ratio or GCR is increased by way of the present novel transistor design. GCR increases by increasing the area of the floating gate that is capacitively coupled to the control gate relative to the area of the floating gate that is capacitively coupled to the tunnel oxide overlying the active cell region. As shown, the control gate couples to the floating gate through exposed surfaces of edge 1029, upper horizontal region 1027C, and vertical region 1027B. Floating gate couples to the tunnel oxide through the lower horizontal region 1027A. Accordingly, control gate couples to the floating gate through at least two additional surface regions. Ideally, GCR approaches one in embodiments of the present invention. Practically, however, it is quite difficult for GCR to equal one. Accordingly, GCR ranges from values greater than 0.3, or greater than 0.5, or greater than 0.6, or greater than 0.8 in the embodiments of the present invention, although GCR is not limited to these values. The exact value of GCR depends upon the particular geometric configuration of the floating gate as well as the design rule of the device. Of course, the final GCR value will depend upon the particular application.

The device of FIG. 7 is commonly programmed by way of a high voltage device, which applies a high voltage to selected regions of the device to introduce electrons into the floating gate, for example. The high voltage device is often defined in a peripheral or non-cell region of the semiconductor integrated circuit. In a specific embodiment, the high voltage device is fabricated on an oxide layer of a second thickness, which is much thicker than the first thickness. The oxide of first thickness and second thickness can be formed using the techniques described above according to a preferred embodiment of the present invention.

In a preferred embodiment, the present memory cell can be programmed and erased by placing voltages on selected gate structures. To program the floating gate or add electrons to the floating gate, selected voltages are applied to the gate structures and source/drain regions. Electrons migrate from the source region through the channel region and inject through the tunnel oxide layer to the floating gate, where electron charge builds up. To erase the floating gate or remove electrons from the floating gate, selected voltages are applied to the gate structures and the source/drain regions. Electrons migrate from the floating gate through the tunnel oxide layer to the channel region and out through the drain region.

The embodiments described above are merely examples of flash memory devices. Integrated circuits include one or more of these devices in a cell. Thousands, millions, billions, and even trillions of these devices are formed in a single integrated circuit chip. Thus, the integrated circuit chip can have up to 4 Meg., 16 Meg. 64 Meg. 256 Meg., 1 Gig. or more devices on a single sliver of silicon. The channel length of these devices range from about 0.4 µm to 0.25 µm and less. The flash memory device can be formed in a stand alone integrated circuit chip, commonly termed the flash memory chip, in some embodiments. Alternatively, the flash memory device can be integrated into a microprocessor, microcomputer, digital signal processor, application specific integrated circuit, and the like. Of course, the number of cells and design size depend highly upon the application.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of forming a semiconductor device comprising:

providing a semiconductor substrate including a memory region and a periphery region;

forming a first gate oxide layer having a first thickness on said semiconductor substrate;

forming a first conducting layer on said first gate oxide layer;

masking and patterning said first conducting layer and said first gate oxide layer to form a first memory gate electrode in said memory region and a first periphery gate electrode in said periphery region;

forming by thermal oxidation a second gate oxide layer over a portion of said periphery region exclusive of said first periphery gate electrode, said second gate oxide layer having a second thickness different than said first thickness;

forming a second conducting layer on at least said second gate oxide layer;

masking and patterning said second conducting layer and said second gate oxide to form a second memory gate electrode in said memory region and a second periphery gate electrode in said periphery region.

2. The method of claim 1 further comprising depositing and patterning a dielectric layer on said first memory gate electrode and on said first periphery gate electrode before said forming said second gate oxide layer.

3. The method of claim 2 wherein said dielectric layer is a oxide/nitride/oxide layer, and said first and second conducting layers are comprised of polysilicon.

4. The method of claim 2 wherein said dielectric layer is formed by chemical vapor deposition.

5. The method of claim 2 wherein said second memory gate electrode comprises a split gate cell control gate electrode over said portion of said first memory gate electrode and over a portion of said dielectric layer not over said first memory gate electrode, and where said first memory gate electrode comprises a floating gate electrode.

6. A semiconductor device formed by the method according to claim 5 wherein said semiconductor device comprises an EEPROM semiconductor device.

7. The method of claim 2 wherein said second memory gate electrode comprises a split gate cell floating gate electrode over said portion of said first memory gate electrode and over a portion of said dielectric layer not over said first memory gate electrode, and where said first memory gate electrode comprises a select gate electrode.

8. A semiconductor device formed by the method according to claim 7 wherein said semiconductor device comprises an EEPROM semiconductor device.

9. The method of claim 1 wherein said first thickness is about 30–150 Å.

10. The method of claim 9 wherein said first gate oxide layer is formed using a thermal oxidation process in an oxygen-containing furnace.

11. The method of claim 10 wherein said thermal oxidation process is at about 850° C. and about 760 torr for about 30 minutes.

12. The method of claim 9 wherein said second thickness is about 100–500 Å.

13. The method of claim 12 wherein said second gate oxide layer is formed using a thermal oxidation process in an oxygen-containing furnace.

14. The method of claim 13 wherein said thermal oxidation process is at about 850° C. and about 760 torr for about 30 minutes.

15. The method of claim 1 wherein said first thickness is about 70 Å or less.

16. The method of claim 4 wherein said second thickness for said second gate oxide layer is about 250 Å or less.

17. The method of claim 1 wherein said first thickness provides high driving capability for the semiconductor device, and said second thickness provides high voltage reliability of the semiconductor device.

18. The method of claim 1 wherein said semiconductor device comprises an EEPROM semiconductor device.

19. The method of claim 18 wherein said EEPROM semiconductor device comprises a flash EEPROM semiconductor device.

20. The method of claim 1 wherein said second memory gate electrode comprises a stack gate cell control gate electrode over said first memory gate electrode, and said first memory gate electrode comprises a floating gate electrode.

21. The method of claim 20, wherein a third memory gate electrode is formed from said second conducting layer in said memory region, said third memory gate electrode comprising a select gate.

22. A semiconductor device formed by the method according to claim 20 wherein said semiconductor device comprises an EEPROM semiconductor device.

23. A method of fabricating an integrated circuit comprising a flash memory device, said method comprising:

providing a substrate, said substrate having a flash memory cell region, an MOS device region, and a high voltage device region;

forming a dielectric layer overlying said flash memory cell region and said MOS device region, said dielectric layer overlying said flash memory cell region being a tunneling layer, and said dielectric layer overlying said MOS device region being a gate dielectric region;

forming a floating gate overlying a portion of said dielectric layer overlying said flash memory cell region and forming an MOS transistor gate overlying a portion of said dielectric layer overlying said MOS device region, said floating gate and said MOS transistor gate being defined from a first conductive layer;

forming an interlayer dielectric overlying said floating gate and said MOS transistor gate;

removing a portion of said interlayer dielectric overlying said MOS transistor gate and clearing said high voltage device region from oxides and nitrides;

forming a thick dielectric layer overlying said high voltage device region; and forming a control gate overlying said floating gate and a high voltage gate overlying a portion of said thick dielectric layer overlying said high voltage device region, said control gate and said high voltage gate being derived from a second conductive layer.

\* \* \* \* \*

UNITED STATES PATENT AND TRADEMARK OFFICE
CERTIFICATE OF CORRECTION

| | |
|---|---|
| PATENT NO. | : 6,184,093 B1 |
| DATED | : February 6, 2001 |
| INVENTOR(S) | : Kuo-Tung Sung |

Page 1 of 1

It is certified that error appears in the above-identified patent and that said Letters Patent is hereby corrected as shown below:

<u>Claim 16, column 14,</u>
Lines 62 and 63,
16. The method of claim [4] <u>15</u> wherein said second thickness for said second gate oxide layer is about 250 Å or less.

Signed and Sealed this

Twenty-third Day of October, 2001

Attest:

NICHOLAS P. GODICI
*Attesting Officer*   *Acting Director of the United States Patent and Trademark Office*